United States Patent [19]
Terashima et al.

[11] Patent Number: 5,600,698
[45] Date of Patent: Feb. 4, 1997

[54] X-RAY EXPOSURE APPARATUS

[75] Inventors: Shigeru Terashima, Utsunomiya; Takeshi Miyachi, Zama, both of Japan

[73] Assignee: Canon Kabushiki Kaisha, Tokyo, Japan

[21] Appl. No.: 416,097

[22] Filed: Apr. 4, 1995

[30]     Foreign Application Priority Data

Apr. 4, 1994  [JP]  Japan .................................. 6-089168
Mar. 28, 1995 [JP]  Japan .................................. 7-094510

[51] Int. Cl.$^6$ ............................................ G03F 7/20
[52] U.S. Cl. ............................................ 378/34; 378/206
[58] Field of Search .............................. 378/34, 35, 205, 378/206

[56]              References Cited

U.S. PATENT DOCUMENTS

| 5,131,022 | 7/1992 | Terashima et al. . | |
| 5,157,700 | 10/1992 | Kurosawa et al. . | |
| 5,161,176 | 11/1992 | Ebinuma et al. | 378/34 |
| 5,225,892 | 7/1993 | Matsugu et al. | 378/34 X |
| 5,299,251 | 3/1994 | Kikuiri et al. | 378/34 |
| 5,317,615 | 5/1994 | Ebinuma et al. | 378/34 |
| 5,356,686 | 10/1994 | Fujioka et al. . | |
| 5,390,227 | 2/1995 | Mizusawa et al. | 378/34 |

FOREIGN PATENT DOCUMENTS 61-172328  8/1986  Japan .
03253018  11/1991  Japan .

Primary Examiner—David P. Porta
Attorney, Agent, or Firm—Fitzpatrick, Cella, Harper & Scinto

[57]              ABSTRACT

An exposure apparatus for transferring a pattern of a mask onto a substrate, includes a regulating an member for regulating exposure beam from a light source, and an alignment optical system for projecting an alignment beam to an alignment mark of the mask, to perform alignment between the mask and the substrate. The regulating member is arranged to pass the alignment light therethrough. The distance E from the regulating member to the mask satisfies the relation $$E \geq (f+m)/2(\tan\theta + \tan\gamma,)$$

where, as viewed from a direction of formation of an edge of the regulating member, $\theta$ is the angle defined between an optical axis of the alignment beam and an optical axis of the exposure beam, f is the beam width of a portion of the alignment beam passing through the regulating member, $\gamma$ is the maximum of a divergence angle, in an exposure region, of the exposure beam, and m is the width of the alignment mark.

6 Claims, 5 Drawing Sheets

X-RAY EXPOSURE APPARATUS

FIELD OF THE INVENTION AND RELATED ART

This invention relates generally to an exposure apparatus and, more particularly, to an exposure apparatus which uses, as exposure light, radiation light (SR-X rays) from a charged particle accumulation ring.

X-ray exposure apparatuses which use, as exposure light, X-rays such as radiation light (SR-X rays) from a charged particle accumulation ring, for example, are capable of transferring and printing a fine circuit pattern of a line width of about 0.25 micron, as required for an integration circuit of 256 megabit DRAM. Thus, these exposure apparatuses have received much attention.

In such X-ray exposure apparatuses, usually a step-and-repeat exposure process is adopted wherein a circuit pattern of a mask is first transferred and printed on one of a predetermined number of exposure regions of a substrate, such as a wafer, and, subsequently, similar pattern transferring and printing operations are sequentially executed on the remaining exposure regions.

Many such exposure apparatuses are equipped with aperture means having a regulating member for regulating the exposure region so as to prevent an unnecessary peripheral portion of the exposure light from impinging, during the exposure process of one exposure region, on adjacent exposure regions, which would otherwise cause an undesirable decrease in the contrast of the circuit pattern, for example, to be printed on those exposure regions (Japanese Laid-Open Patent Application, Laid-Open No. 172328/1986 and No. 253018/1991)

FIG. 7 is a schematic view of a main portion of a known type X-ray exposure apparatus. Wafer $W_0$ is held by a positioning stage (not shown), and the surface of the wafer $W_0$ is coated with a resist. It is exposed with an X-ray beam $L_0$ projected thereto through a mask $M_0$, such that a circuit pattern of the mask $M_0$ is transferred to and printed on the wafer. In the path of the X-ray beam $L_0$, there is an aperture member 101 for blocking an unnecessary peripheral portion of the X-ray beam $L_0$. Member 101 serves to prevent exposure of areas around of a particular exposure region of the wafer $W_0$. The aperture member 101 comprises plate members having a light blocking property sufficient to block the X-rays, and, for example, it comprises four aperture blades 111 each made of a glass material having a thickness of about 200 microns.

The mask $M_0$ comprises an X-ray transmission film which is transmissive to X-rays, and an X-ray blocking film made of a metal, for example, which adheres to the X-ray transmission film. The mask $M_0$ has a circuit pattern $P_0$ by which a predetermined circuit pattern can be printed on the circuit pattern transfer region $S_O$ of the wafer $W_0$. In a portion outside the circuit pattern $P_0$, there are alignment marks (not shown) to be used for the alignment of the mask $M_0$ and the wafer $W_0$, for transfer of that circuit pattern, and transfer alignment marks $A_0$ by which alignment marks for a subsequent lithographic process can be transferred to scribe lines, at the edges of the pattern transfer region $S_0$, on the wafer $W_0$ together with the circuit pattern.

Before or during such an exposure process by use of the X-ray beam $L_0$, the alignment operation for aligning the wafer $W_0$ and the mask $M_0$ is performed by using the alignment marks of the mask $M_0$ and the alignment marks which have been printed on the wafer $W_0$ through the preceding lithographic process. In this alignment operation, alignment lights $F_0$ produced by alignment optical systems 103 disposed aside the path of the X-ray beam $L_0$, are projected onto the mask $M_0$ and then onto the wafer $W_0$, and the positioning stage for the wafer $W_0$ is moved so that the alignment marks of the mask $M_0$ overlap with the alignment marks of the wafer $W_0$, respectively.

Because the alignment beams $F_0$ are projected from the alignment optical systems 103, disposed outside of the path of the X-ray beam $L_0$, obliquely to cross aperture blades 111 of the aperture member 101, usually each aperture blade is made of a material transmissive to the alignment beam $F_0$ or, alternatively, the aperture blades are retracted before the alignment operation.

In a structure wherein each aperture blade of the aperture member, for blocking an unnecessary peripheral portion of the X-ray beam, is made of a material which is transmissive to the alignment light, if edges of the aperture blades are placed in the path of the alignment light, the alignment light may be irregularly reflected or diffracted by the edge of the aperture blade such that the alignment precision may be degraded considerably.

In a structure wherein the aperture blades are retracted before the alignment operation using alignment light, it is not possible to perform the alignment operation during the exposure process of a wafer and, therefore, it is difficult to prevent a positional deviation from occurring between the mask and a wafer caused during the exposure process.

SUMMARY OF THE INVENTION

It is accordingly an object of the present invention to provide an exposure apparatus by which degradation of alignment precision, for mask and wafer alignment due to the effect of irregular reflection or diffraction of alignment light at an edge of an opening of an aperture member, is avoided.

In accordance with an aspect of the present invention, there is provided an exposure apparatus for transferring a pattern of a mask onto a substrate, the apparatus comprising: a regulating member for regulating exposure light from a light source; and an alignment optical system for projecting alignment light to an alignment mark of the mask, to perform alignment between the mask and the substrate; wherein the regulating member is arranged to pass the alignment light therethrough; and wherein a distance E the said regulating member to the mask satisfies the relation $$E \geq (f+m)/2(\tan\theta + \tan\gamma)$$

where, as viewed from a direction of formation of an edge of the regulating member, $\theta$ is the angle defined between an optical axis of the alignment light and an optical axis of the exposure light, f is the beam width of a portion of the alignment light passing through the regulating member, $\gamma$ is the maximum of a divergence angle, in an exposure region, of the exposure light, and m is the width of the alignment mark.

When the aforementioned relation is satisfied with respect to the distance E between the regulating member and the mask, all the alignment light is projected onto the mask and the substrate through a portion outside the opening defined by the regulating member. Thus, the alignment light is not regularly reflected or diffracted by the edge of the regulating member.

These and other objects, features and advantages of the present invention will become more apparent upon a con-

DESCRIPTION OF THE PREFERRED EMBODIMENTS

Embodiment 1

Figure 1:
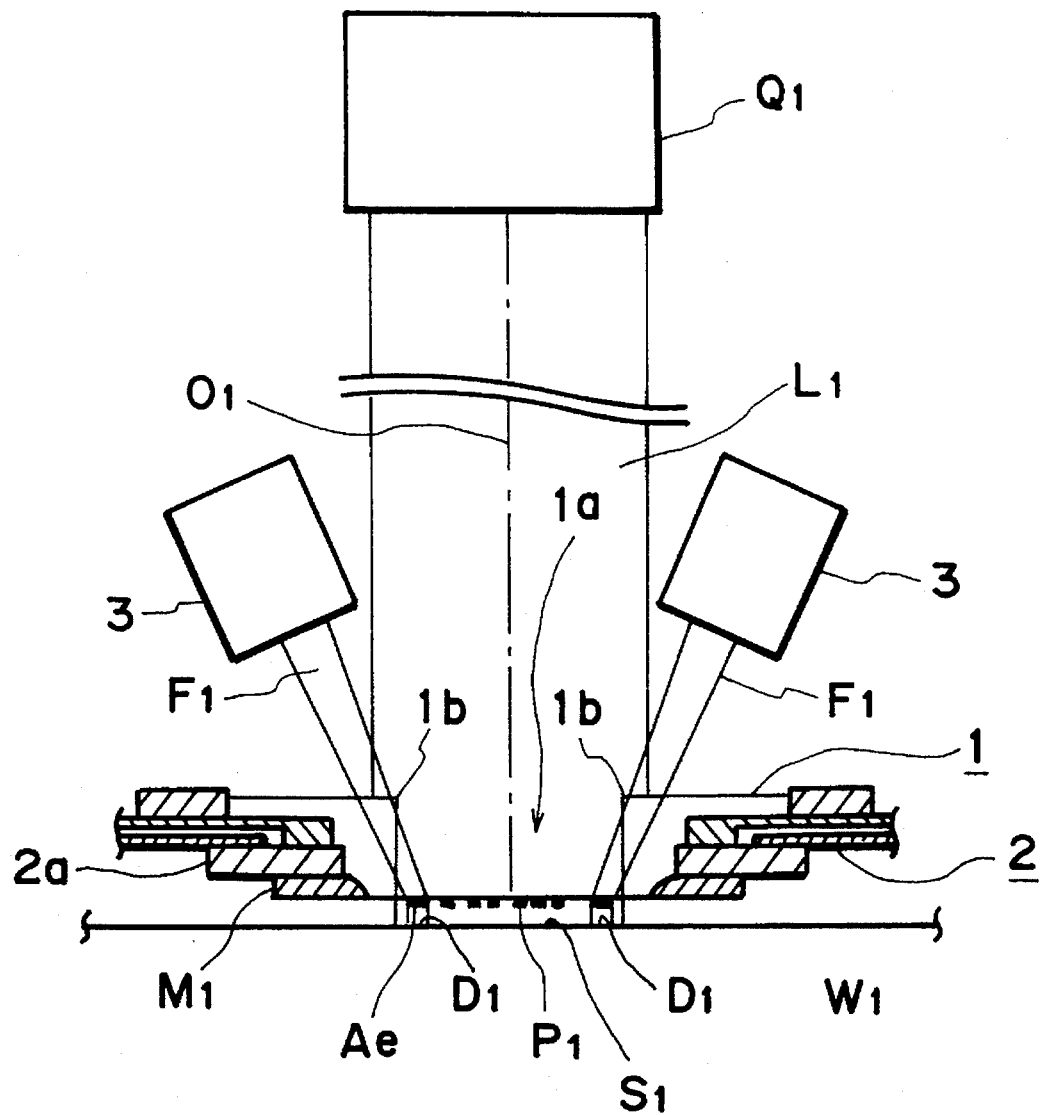
FIG. 1 is a schematic sectional view for explaining a main portion of an exposure apparatus according to a first embodiment of the present invention.

FIG. 1 is a schematic view for explaining a main portion of an exposure apparatus according to a first embodiment of the present invention. The exposure apparatus comprises a positioning stage (not shown) for holding a wafer (substrate) $W_1$. This positioning stage is able to perform stepwise motion and an alignment operation for the wafer $W_1$, in a known manner. The exposure apparatus further comprises an aperture blade (regulating member) 1 provided by a glass plate of a thickness of 200 microns, for blocking an unnecessary outside peripheral portion of illumination light $L_1$ such as a radiation X-ray beam from a light source $Q_1$, such as a charged particle accumulation ring, for example.

The exposure apparatus further comprises a mask stage 2 for positioning a mask $M_1$ in juxtaposition of to the wafer $W_1$. The mask stage 2 serves to hold a mask frame $2a$ which is integral with the mask $M_1$. The mask $M_1$ comprises an X-ray transmission film, being transmissive to X-rays, and an X-ray blocking film such as gold which adheres to the X-ray transmission film. The mask further comprises a circuit pattern $P_1$ by which a predetermined circuit pattern can be printed in a circuit pattern transfer region $S_1$ on the wafer $W_1$. In a portion outside the circuit pattern, there are alignment marks (not shown) to be used for the alignment of the mask $M_1$ and the wafer $W_1$, and transfer alignment marks $A_e$ by which alignment marks for a subsequent lithographic process can be transferred to scribe lines $D_1$ on the wafer $W_1$ together with the circuit pattern.

In the exposure process of the wafer $W_1$ with the X-ray beam $L_1$, an unnecessary outside peripheral portion of the X-ray beam $L_1$ is blocked by the aperture member 1, for regulation of the X-ray beam $L_1$, and the portion of the X-ray beam $L_1$ passing the opening $1a$ of the aperture member 1 is projected on the mask $M_1$. By this, arrangement the circuit pattern of the mask $M_1$ as well as alignment marks, to be used in the subsequent lithographic process, are transferred to the wafer $W_1$.

Before or during such an exposure process by use of the X-ray beam $L_1$, the alignment operation for aligning the wafer $W_1$ and the mask $M_1$ is performed by using the alignment marks of the mask $M_1$ and the alignment marks having been printed on the scribe lines $D_1$ of the wafer $W_1$ through the preceding lithographic process. In this alignment operation, alignment beams $F_1$ produced by alignment optical systems 3 disposed aside the path of the X-ray beam $L_1$, are projected onto the mask $M_1$ and then onto the wafer $W_1$, and the positioning stage for the wafer $W_1$ is moved so that the alignment marks of the mask $M_1$ overlap with the alignment marks of the wafer $W_1$, respectively. Because the alignment operation for the wafer $W_1$ and the mask $M_1$ is performed by using the alignment beams $F_1$ being projected from outside of the path of the X-ray beam $L_1$, the aperture member 1 is made of a material which is non-transmissive to the X-ray beam $L_1$ but is transmissive to the alignment beam $F_1$. If, for example, the used alignment beam $F_1$ comprises light of a wavelength of 780 nm, a glass plate of a thickness 200 microns may be used.

While the aperture member 1 is made of a material which is transmissive to the alignment beam $F_1$, if edges $1b$ of the opening $1a$ of the aperture member 1 are placed in the path of the alignment light $F_1$, a portion of the alignment light $F_1$ may be irregularly reflected or diffracted by the edge $1b$ of the opening $1a$ such that alignment precision may be degraded considerably.

In consideration of this, the interval distance E between the aperture member 1 and the mask $M_1$ is made larger than a minimum e as calculated by equation (1) below, to assure that the X-ray beam passing through the opening $1a$ of the aperture member 1 has a width sufficient for illuminating the transfer alignment marks $A_e$ of the mask $M_1$ to transfer them onto the scribe lines $D_1$ on the wafer $W_1$ but, nevertheless, that each edge $1b$ of the opening $1a$ of the aperture member 1 is placed outside the path of the alignment light $F_1$. This assures prevention of degraded alignment precision due to irregular reflection, for example, of the alignment beam $F_1$.

$$e+(f+m)/2(\tan\theta+\tan\gamma) \tag{1}$$

wherein: θ is the angle defined between the optical axis $O_1$ of the X-ray beam $L_1$ and the optical axis of the alignment $F_1$ as projected on a plane perpendicular to the edge of the aperture member 1; f is the beam width of the alignment beam $F_1$ in a direction perpendicular to the edge of the aperture member 1 as the alignment beam $F_1$ passes the aperture member 1; γ is the maximum divergence angle, in the exposure region, of the X-ray beam $L_1$ as projected upon a plane perpendicular to the edge of the aperture 1; and m is the width of the transfer alignment mark $A_e$ in a direction perpendicular to the edge of the aperture member 1.

Equation (1) mentioned above is derived as follows.

Figure 2:
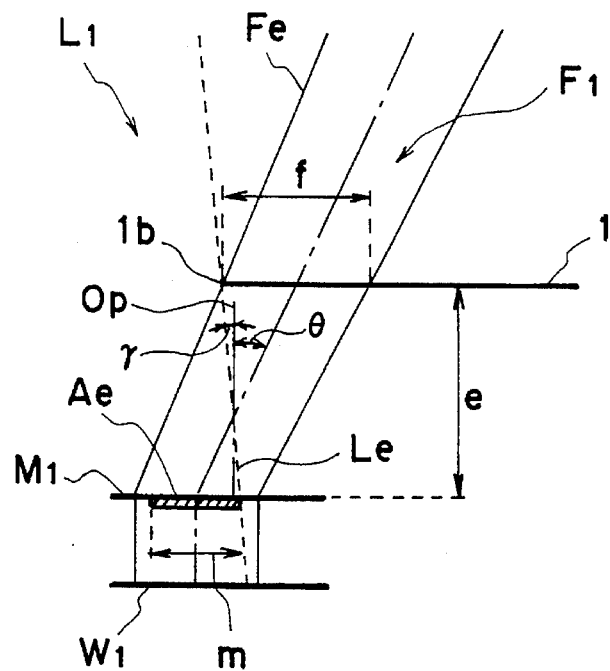
FIG. 2 is a schematic view for explaining the relations among the exposure X-ray beam, the alignment light, the edges of an aperture member and the transfer alignment mark of a mask, in the exposure apparatus of FIG. 1, wherein the upper portion thereof illustrates a case where the interval distance between the aperture member and the mask is at a minimum and wherein the lower portion thereof illustrates a case where the interval distance is larger than the minimum.
Figure 2:
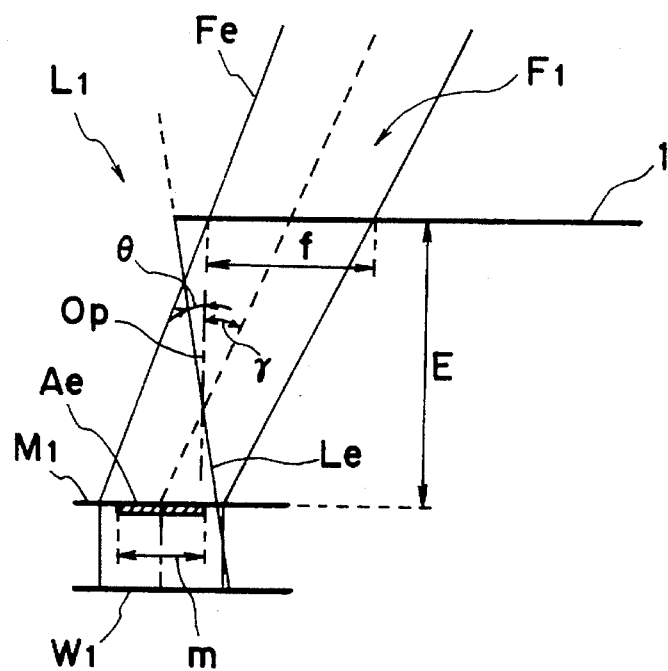

As illustrated in the upper portion of FIG. 2, when the outermost peripheral portion $L_e$ of the X-ray beam $L_1$, having passed the opening $1a$ of the aperture member 1, reaches the outermost peripheral edge of the transfer alignment mark $A_e$, in the aforementioned direction, of the mask $M_1$ and when the innermost peripheral portion $F_e$ of the alignment beam $F_1$ in the aforementioned direction impinges on the edge $1b$ of the opening $1a$ of the aperture member 1, the optical axis of the alignment beam $F_1$ is incident on the center of the alignment mark of the mask. Also, the optical axis $O_1$ of the exposure X-ray beam is incident perpendicularly on the mask and the aperture member. This is depicted in FIG. 2 by a line $O_p$ which is parallel to the optical axis $O_1$. Under these conditions, the following relation applies:

$$e \cdot \tan\theta + e \cdot \tan\gamma = f/2 + m/2$$

That is, $$e = (f+m)/2(\tan\theta + \tan\gamma) \quad (2)$$

Thus, if the interval distance E between the aperture member 1 and the mask $M_1$ is larger than the minimum e, as shown in FIG. 2, as shown in the lower portion of FIG. 2, the innermost periphery $F_e$ of the alignment beam $F_1$ is positioned outside the edge $1b$ of the opening $1a$ of the aperture 1. Thus, there is no possibility of irregular reflection or diffraction of the alignment light. Also, it is sufficient that the X-ray beam $L_1$ passing the opening $1a$ of the aperture member 1 impinges on the outermost periphery of the transfer alignment mark $A_e$ of the mask $M_1$.

EXAMPLE

On condition that the inclination angle $\theta$ of the optical axis of the alignment beam $F_1$ with respect to the optical axis $O_1$ of the X-ray beam $L_1$ is 35 mrad; the beam width in the aforementioned direction of the alignment beam $L_1$ at the aperture position is 800 microns (maximum); the maximum $\gamma$ of the divergence angle of the X-ray beam $L_1$ is 2 mrad; the width in the aforementioned direction of the transfer alignment mark $A_e$ of the mask $M_1$ is 100 microns, then the minimum e of the interval distance E between the aperture member 1 and the mask $M_1$ is 12.2 mm as can be calculated in accordance with equations (1) and (2). The set interval distance E between the aperture member 1 and the mask $M_1$ may be 15 mm, to provide a sufficient margin or latitude.

Embodiment 2

Figure 3:
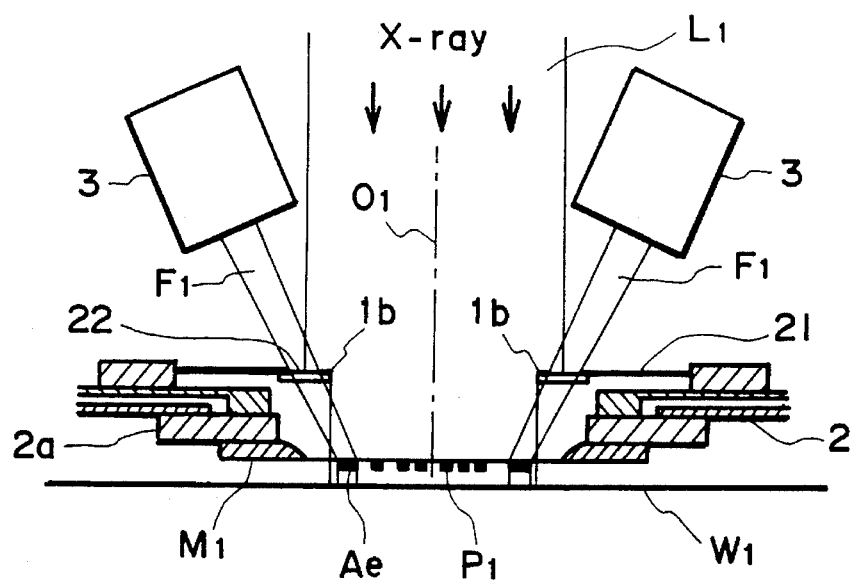
FIG. 3 is a schematic sectional view for explaining a main portion of an exposure apparatus according to a second embodiment of the present invention.
Figure 4:
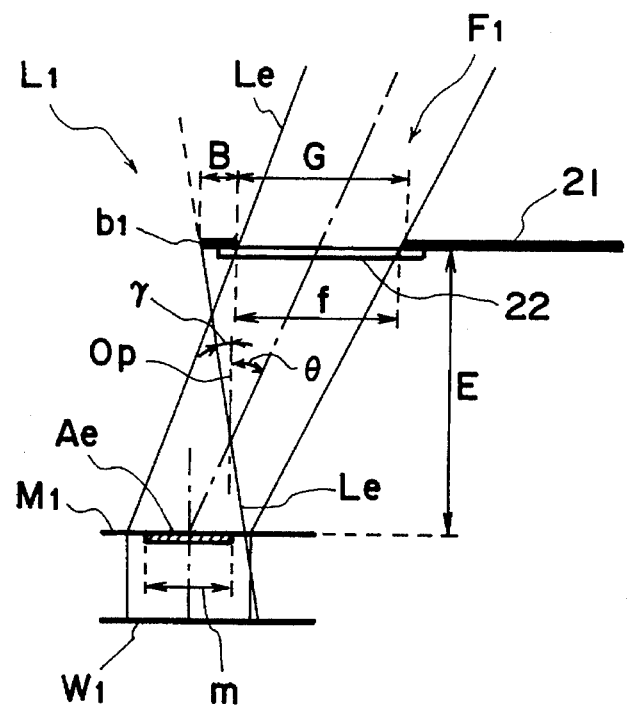
FIG. 4 is a schematic view for explaining the relations among the exposure X-ray beam, the alignment light, the edges of an aperture member, the alignment light transmitting window of the aperture member and the transfer alignment mark of a mask, in the exposure apparatus of FIG. 3.

FIG. 3 is a schematic view for explaining a main portion of an exposure apparatus according to a second embodiment of the present invention. FIG. 4 is a schematic view, like the lower portion of FIG. 2, for explaining the relations among the exposure X-ray beam, the alignment light, the alignment mark and the aperture blade.

Since the edge of the aperture blade means (aperture means) which defines an opening should have a shape of good linearity, in this embodiment the aperture blade member is made of a metal having a good machining property, and a window for passing alignment light is formed therein.

In FIG. 3, denoted at 21 are blades of the aperture means, each being made of a metal and each having a window 22 for the passage of alignment light. As best seen in FIG. 4, the window 22 is formed in a portion of the aperture means at a distance B from the edge $b_1$ of the aperture blade 21. The window 22 is made of a material which is non-transmissive to X-ray beam $L_1$ but is transmissive to the alignment beam $F_1$. If, for example, the used alignment beam $F_1$ comprises light of a wavelength 780 nm, the window may be made of a glass material of a thickness 200 microns. It is to be noted that this alignment light window may be provided by an opening simply, if, as shown in FIG. 4, the outside periphery of the projected X-ray beam (not shown in FIG. 4) is placed in a portion, such as depicted at B, between the aperture edge and the window.

The width of the window aperture is set to be larger than the beam width f of the alignment beam $F_1$ in a direction perpendicular to the optical axis $O_1$ of the X-ray beam $L_1$ as the alignment beam $F_1$ passes the aperture 21.

Here, as regards the interval distance E between the aperture member 21 and the mask $M_1$, the following relations are derived as in the preceding embodiment:

$$E(\tan\theta + \tan\gamma) = (f+m)/2 + B \quad (3)$$

$$e = \{(f+m)/2 + B\}/(\tan\theta + \tan\gamma) \quad (4)$$

From theses equations, apparently it follows that:

$$E \geq (f+m)/2(\tan\theta + \tan\gamma) \quad (5)$$

wherein: $\theta$ is the angle defined between the optical axis $O_1$ of the X-ray beam $L_1$ and the optical axis of the alignment beam $F_1$ as projected on a plane perpendicular to the edge of the aperture member 1; f is the beam width of the alignment beam $F_1$ in a direction perpendicular to the edge of the aperture member 1 as the alignment light $F_1$ passes the aperture member 1; $\gamma$ is the maximum divergence angle, in the exposure region, of the X-ray beam $L_1$ as projected upon a plane perpendicular to the edge of the aperture 1; and m is the width of the transfer alignment mark $A_e$ in a direction perpendicular to the edge of the aperture member 1.

Example

On condition that the distance B from the edge of the aperture member to the window is 1 mm; the inclination angle $\theta$ of the optical axis of the alignment beam $F_1$ with respect to the optical axis $O_1$ of the X-ray beam $L_1$ is 35 mrad; the beam width in the aforementioned direction of the alignment beam $L_1$ at the aperture position is 800 microns (maximum); the maximum $\gamma$ of the divergence angle of the X-ray beam $L_1$ is 2 mrad; the width in the aforementioned direction of the transfer alignment mark $A_e$ of the mask $M_1$ is 100 microns, then the interval distance E between the aperture member 1 and the mask $M_1$ is 40.7 mm as can be calculated in accordance with equation (4). In consideration of a possibility of diffraction at the edge of the window 22, for example, the set interval distance E between the aperture member 1 and the mask $M_1$ may be 42 mm. Apparently, this value is larger than a value 12.2 mm to be obtained when the parameters are substituted into the right-hand side of equation (5). This setting assures that the alignment light passes through a predetermined window, and is not affected by the aperture blade. Thus, high alignment precision is attainable.

Embodiment 3

Figure 5:
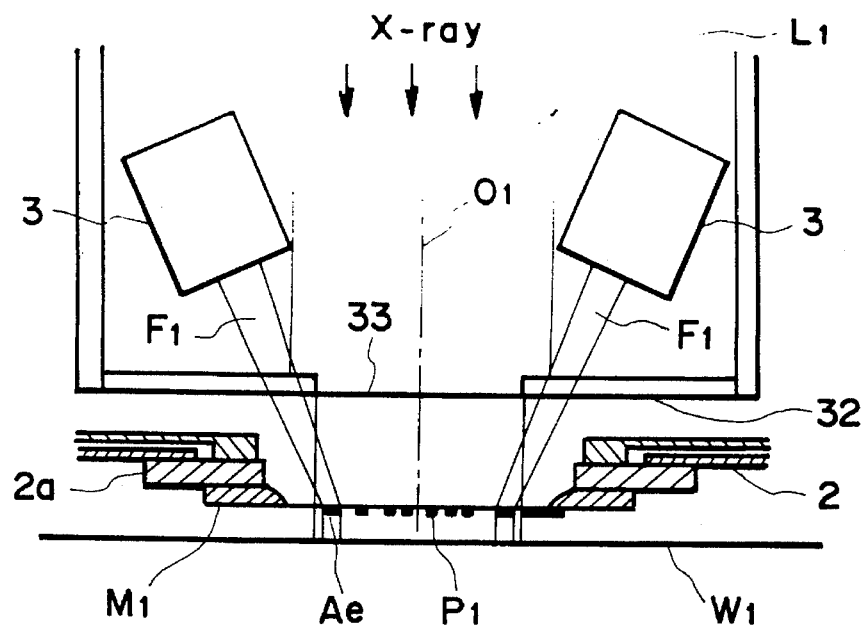
FIG. 5 is a schematic sectional view for explaining a main portion of an exposure apparatus according to a third embodiment of the present invention.

FIG. 5 is a schematic view for explaining a main portion of an exposure apparatus according to a third embodiment of the present invention.

In this embodiment, the invention is applied to an exposure apparatus of what can be called an "atmospheric exposure" type, wherein the exposure process is performed while a mask and a wafer are placed in an atmospheric ambience.

In such an atmospheric exposure process, the structure is such that a beam line of SR (synchrotron radiation) extends close to a mask. In FIG. 5, denoted at 31 is a beam line, and denoted at 32 is an X-ray projecting window. Denoted at 33 is a bean line end which serves to connect the X-ray projecting window 32 to the beam line and also to define an opening for regulating the exposure region. Denoted at 3 are alignment optical systems which are disposed within the beam line. A mask and a wafer used are of the same structure as the preceding embodiment.

Figure 6:
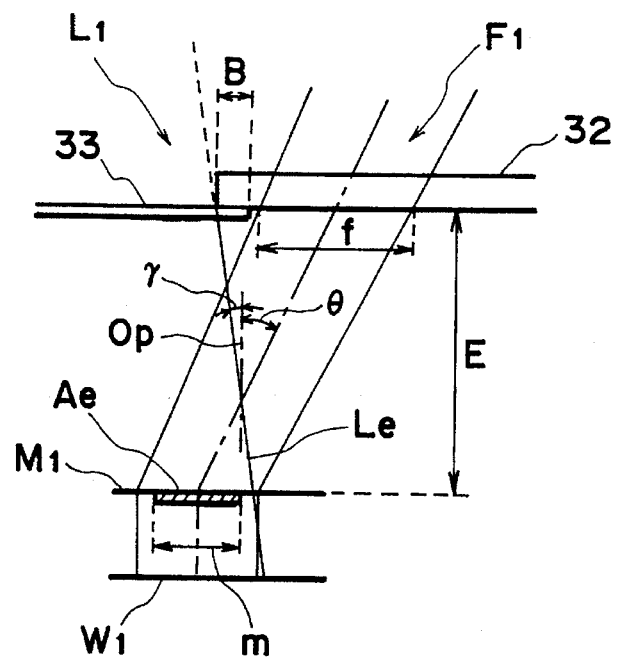
FIG. 6 is a schematic view for explaining the relations among the exposure X-ray beam, the alignment light, the edges of an X-ray transmitting window of a beam line end and the transfer alignment mark of a mask, in the exposure apparatus of FIG. 5.
Figure 7:
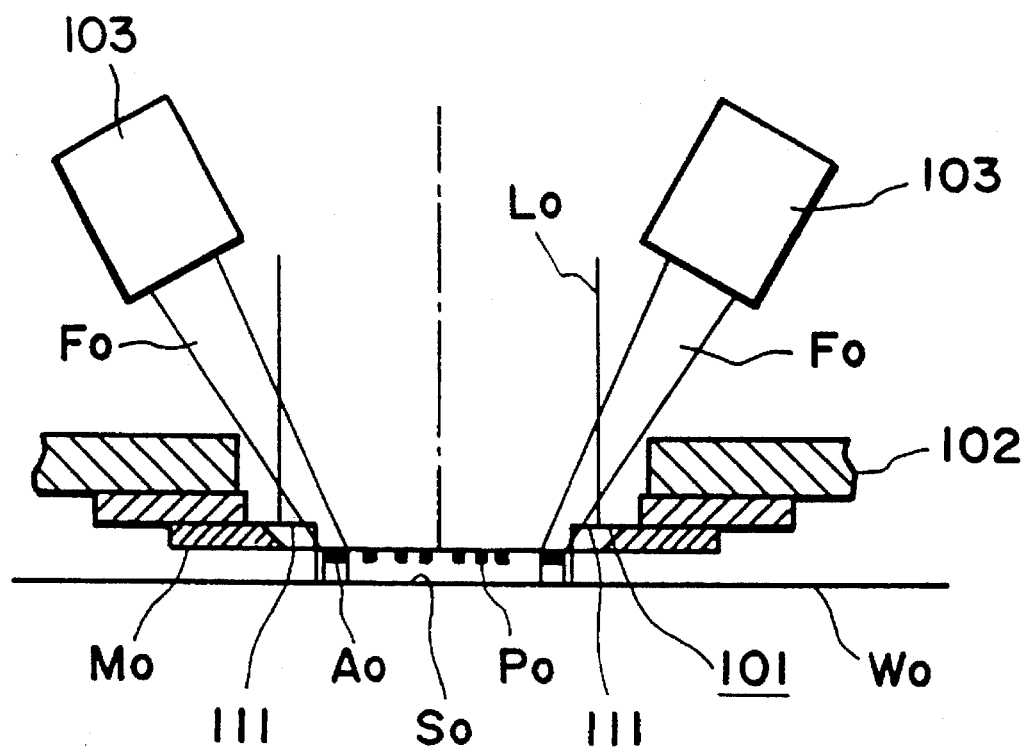
FIG. 7 is a schematic sectional view for explaining a main portion of an exposure apparatus of a known type.

FIG. 6 illustrates the details of the relations among the exposure X-ray beam, the alignment light, the alignment mark, the beam line and the opening, like the lower portion of FIG. 2.

In this embodiment, the X-ray projecting window 32 which is fixed to the beam line end 33 serves as regulating means, and it defines an opening for regulating the exposure region. Since X-ray lithography uses soft X-rays, the X-ray projecting window 32 may comprise a thin film having good transmissivity to soft X-rays. For example, a beryllium film of a thickness 10 microns may be used.

The beam line end 33 should block the X-rays for regulation of the exposure region and it should fixedly mount the X-ray projection window 32. Also, it should transmit the alignment beam $F_1$, at least in the path of the alignment beam. To these ends, the beam line end 33 may be made of a glass material of a thickness 1 mm. It is to be noted that this portion may be provided by locally defining a window, as in the preceding embodiment.

As best seen in FIG. 6, there should be an overlapping margin of a width B for overlapping and fixedly mounting the X-ray projecting window 32 onto the beam line end 33. Since the X-ray projecting window is made of a thin film of beryllium, it does not transmit the alignment beam. For this reason, the alignment beam should be transmitted through a portion other than the margin B. In consideration of this, as regards the interval distance E between the beam line end 33 and the mask $M_1$, the following relations may be derived, like the preceding embodiment:

$$E(\tan\theta+\tan\gamma)=(f+m)/2+B \quad (6)$$

$$E=\{(f+m)/2+B\}/(\tan\theta+\tan\gamma) \quad (7)$$

From theses equations, apparently it follows that:

$$E \geq (f+m)/2(\tan\theta+\tan\gamma) \quad (8)$$

wherein: $\theta$ is the angle defined between the optical axis $O_1$ of the X-ray beam $L_1$ and the optical axis of the alignment beam $F_1$ as projected on a plane perpendicular to the edge of the aperture member 1; f is the beam width of the alignment beam $F_1$ in a direction perpendicular to the edge of the aperture member 1 as the alignment beam $F_1$ passes the aperture member 1; $\gamma$ is the maximum divergence angle, in the exposure region, of the X-ray beam $L_1$ as projected upon a plane perpendicular to the edge of the aperture 1; and m is the width of the transfer alignment mark $A_e$ in a direction perpendicular to the edge of the aperture member 1.

Example

On condition that the margin width B between the X-ray projecting window 32 and the beam line end 33 is 1 mm; the inclination angle $\theta$ of the optical axis of the alignment beam $F_1$ with respect to the optical axis $O_1$ of the X-ray beam $L_1$ is 35 mrad; the beam width in the aforementioned direction of the alignment beam $L_1$ at the aperture position is 800 microns (maximum); the maximum $\gamma$ of the divergence angle of the X-ray beam $L_1$ is 2 mrad; the width in the aforementioned direction of the transfer alignment mark $A_e$ of the mask $M_1$ is 100 microns, then the interval distance E between the beam line end 33 and the mask $M_1$ is 40.7 mm as can be calculated in accordance with equation (7).

In consideration of the difficulty of accurately setting a margin width of 1.000 mm for mounting the X-ray window 32 onto the beam line end 33, the set interval distance E between the aperture member 1 and the mask $M_1$ may be 45 mm, to provide a sufficient latitude. Apparently, this value is larger than a value 12.2 mm to be obtained from the right-hand side of equation (8). This setting assures that the alignment light passes through a predetermined portion of the beam line end, and is not affected by the X-ray projecting window. Thus, high alignment precision is attainable.

While the invention has been described with reference to the structures disclosed herein, it is not confined to the details set forth and this application is intended to cover such modifications or changes as may come within the purposes of the improvements or the scope of the following claims.

What is claimed is:

1. An X-ray apparatus for transferring a circuit pattern and an alignment mark of a mask onto a substrate, said apparatus comprising:

a regulating member for regulating an X-ray exposure beam from an X-ray source; and an alignment optical system for projecting an alignment beam to an alignment mark of the mask, to perform alignment between the mask and the substrate;

wherein said regulating member is able to be arranged between said alignment optical system and the mask, to pass the alignment beam therethrough; and wherein a distance E from said regulating member to the mask satisfies the relation $$E \geq (f+m)/2(\tan\theta+\tan\gamma),$$

where, as viewed from a direction of formation of an edge of said regulating member, $\theta$ is the angle defined between an optical axis of the alignment beam and an optical axis of the X-ray exposure beam, f is the beam width of a portion of the alignment beam passing through said regulating member, $\gamma$ is the maximum of a divergence angle, in an exposure region, of the X-ray exposure beam, and m is the width of the alignment mark.

2. An apparatus according to claim 1, wherein the substrate is placed in an atmospheric ambience during the exposure process thereof.

3. An apparatus according to claim 1, wherein the exposure light comprises synchrotron radiation light.

4. An apparatus according to claim 1, wherein a portion of said regulating member passing the alignment beam is made of a glass material.

5. An apparatus according to claim 4, wherein another portion of said regulating member is made of a metal.

6. An apparatus according to claim 1, wherein the substrate is placed in a reduced pressure ambience during the exposure process thereof.

* * * * *

UNITED STATES PATENT AND TRADEMARK OFFICE
CERTIFICATE OF CORRECTION

PATENT NO. : 5,600,698
DATED : February 4, 1997
INVENTOR(S) : SHIGERU TERASHIMA, ET AL.

It is certified that error appears in the above-indentified patent and that said Letters Patent is hereby corrected as shown below:

ON THE COVER PAGE:

[56] References Cited

FOREIGN PATENT DOCUMENTS

"03253018 11/1991 Japan" should read --3-253018 11/1991 Japan--.

[57] Abstract:

Line 2, "an" (2nd occurrence) should be deleted.

Line 3, "regulating" should read --regulating an--.

Line 10, "$E \geq (f+m)/2(\tan\theta+\tan\gamma,)$" should read --$E \geq (f+m)/2(\tan\theta+\tan\gamma),$--.

UNITED STATES PATENT AND TRADEMARK OFFICE
CERTIFICATE OF CORRECTION

PATENT NO. : 5,600,698
DATED : February 4, 1997
INVENTOR(S) : SHIGERU TERASHIMA, ET AL.

It is certified that error appears in the above-indentified patent and that said Letters Patent is hereby corrected as shown below:

COLUMN 1:

Line 43, "of" (second occurrence) should be deleted.

COLUMN 2:

Line 2, "lights" should read --beams--.

Line 46, "distance E" should read --distance E from--.

Line 47, "said" should be deleted.

Line 48, "E$\geq$(f+m)/2(tan$\theta$+tan$\gamma$,)" should read --E$\geq$(f+m)/2(tan$\theta$+tan$\gamma$),--.

UNITED STATES PATENT AND TRADEMARK OFFICE
CERTIFICATE OF CORRECTION

PATENT NO. : 5,600,698
DATED : February 4, 1997
INVENTOR(S) : SHIGERU TERASHIMA, ET AL.

It is certified that error appears in the above-indentified patent and that said Letters Patent is hereby corrected as shown below:

COLUMN 3:

Line 56, "of" should be deleted.

COLUMN 4:

Line 8, "this, arrangement" should read --this arrangement,--.

Line 53, "alignment" should read --alignment beam--.

UNITED STATES PATENT AND TRADEMARK OFFICE
CERTIFICATE OF CORRECTION

PATENT NO. : 5,600,698
DATED : February 4, 1997
INVENTOR(S) : SHIGERU TERASHIMA, ET AL.

It is certified that error appears in the above-indentified patent and that said Letters Patent is hereby corrected as shown below:

COLUMN 6:

Line 23, "alignment light" should read --alignment beam--.

COLUMN 7:

Line 59, "beam $L_1$," should read --light $F_1$,--.

Signed and Sealed this

Ninth Day of September, 1997

Attest:

Attesting Officer

BRUCE LEHMAN

Commissioner of Patents and Trademarks